(12) United States Patent
Andersson

(10) Patent No.: US 9,920,434 B2
(45) Date of Patent: Mar. 20, 2018

(54) OXIDATION OF COPPER IN A COPPER ETCHING SOLUTION BY THE USE OF OXYGEN AND/OR AIR AS AN OXIDIZING AGENT

(71) Applicant: SIGMA ENGINEERING AB, Karlstad (SE)

(72) Inventor: Mats Andersson, Karlstad (SE)

(73) Assignee: SIGMA ENGINEERING AB, Karlstad (SE)

( * ) Notice: Subject to any disclaimer, the term of this patent is extended or adjusted under 35 U.S.C. 154(b) by 0 days.

(21) Appl. No.: 15/301,181

(22) PCT Filed: Apr. 1, 2015

(86) PCT No.: PCT/EP2015/057166
§ 371 (c)(1),
(2) Date: Sep. 30, 2016

(87) PCT Pub. No.: WO2015/150448
PCT Pub. Date: Oct. 8, 2015

(65) Prior Publication Data
US 2017/0022616 A1    Jan. 26, 2017

(30) Foreign Application Priority Data

Apr. 1, 2014  (EP) .................................... 14163061

(51) Int. Cl.
*C23F 1/46* (2006.01)
*H05K 3/06* (2006.01)
(Continued)

(52) U.S. Cl.
CPC ................. *C23F 1/46* (2013.01); *C23F 1/08* (2013.01); *C23F 1/18* (2013.01); *H05K 3/067* (2013.01);
(Continued)

(58) Field of Classification Search
None
See application file for complete search history.

(56) References Cited

U.S. PATENT DOCUMENTS 3,306,792 A * 2/1967 Thurmel ............. C22B 15/0063
                                                    156/345.18
4,388,276 A    6/1983 Konstantouros et al.
5,013,395 A    5/1991 Blumberg et al.

FOREIGN PATENT DOCUMENTS

CN         101215062 A    7/2008
DE  10 2006 037 084 A1    5/2007
(Continued)

OTHER PUBLICATIONS

PCT International Preliminary Report on Patentability for PCT/EP2015/057166 dated Oct. 4, 2016.*
(Continued)

*Primary Examiner* — Jiong-Ping Lu
(74) *Attorney, Agent, or Firm* — Buchanan Ingersoll & Rooney P.C.

(57) ABSTRACT

The present invention relates to a process of oxidizing copper in a copper etching solution by using oxygen gas and/or air as an oxidizing agent, the process comprising the steps of: a) introducing the oxidizing agent into an acidic reduced copper etching solution comprising $Cl^-$ and $Cu^+$, b) stirring the solution obtained in step a), and thereby allowing the reaction $2Cu^+ + \frac{1}{2}O_2 \text{ (aq)} + 2H^+ \rightarrow 2Cu^{2+} + H_2O$ to occur, thereby producing an oxidized copper etching solution comprising less $Cu^+$ than the reduced copper etching solution. An advantage of the present invention is that it provides an improved process at least in terms of the speed of the oxidation and the quality of the etching.

20 Claims, 7 Drawing Sheets

(51) Int. Cl.
*C23F 1/18* (2006.01)
*C23F 1/08* (2006.01)

(52) U.S. Cl.
CPC ....... *H05K 3/068* (2013.01); *H05K 2203/087* (2013.01)

(56) References Cited

FOREIGN PATENT DOCUMENTS

| EP | 0 048 381 B1 | 4/1985 |
| EP | 0 304 687 A2 | 3/1989 |
| GB | 1142024 A | 2/1969 |

OTHER PUBLICATIONS

International Search Report (PCT/ISA/210) dated Jul. 9, 2015, by the European Patent Office as the International Searching Authority for International Application No. PCT/EP2015/057166.
Written Opinion (PCT/ISA/237) dated Jul. 9, 2015, by the European Patent Office as the International Searching Authority for International Application No. PCT/EP2015/057166.

* cited by examiner

US 9,920,434 B2

OXIDATION OF COPPER IN A COPPER ETCHING SOLUTION BY THE USE OF OXYGEN AND/OR AIR AS AN OXIDIZING AGENT

TECHNICAL FIELD OF THE INVENTION

The present invention relates to a process of oxidizing copper in a copper etching solution by using oxygen gas and/or air as an oxidizing agent, and an oxidized copper etching solution obtainable by the process. The invention further relates to a printed circuit board obtainable by etching using the oxidized copper etching solution, and the use of an oxidized copper etching solution. The invention further relates to a system for oxidizing a copper etching solution.

BACKGROUND

Etching is today a commonly used technique in the production of printed circuit boards. In the production of a printed circuit board, a substrate such as a plastic laminate is coated with a layer of conducting material such as copper. On top of the copper layer, a protective layer of e.g. an organic polymer is provided photochemically to selectively cover certain parts of the copper layer. The coated substrate is etched in an etching machine in which the coated substrate is exposed to a continuous flow of copper etching solution, thereby etching away at least a portion of the copper layer not covered by the protective layer, leaving the protected portions of the copper layer non-etched to produce the conductive layer of the printed circuit board.

In a conventional etching process an oxidizing agent, such as for example hydrogen peroxide, sodium chlorate or gas comprising ozon or chlorine gas, is used for reoxidizing the used copper etching solution in the etching machine. Such oxidizing agents are, however, considered aggressive chemical compounds which negatively affect the working environment and the environment in a broader perspective.

EP 0048381 B1 teaches an alternative process for regeneration of hydrochloric acid copper chloride copper etching solution, wherein etching and regenerating is effected in separate devices between which the copper etching solution is circulated. The copper etching solution is sucked from the etching machine and sprayed into a bell comprising oxygen gas.

Despite of the alternative process in EP 0048381 B1, there is still a need in the art for improved processes of regenerating copper in a copper etching solution.

SUMMARY OF THE INVENTION

It is an object of the present invention to provide an improved process of regenerating copper in a copper etching solution, such as an improved process of oxidizing copper in a copper etching solution. Due to e.g. environmental aspects, the desirable oxidizing agents are oxygen gas and/or air.

The inventors have surprisingly found a process technology which is more efficient than the process taught in EP 0048381 B1. The present invention is based on the concept of generating bubbles of gaseous oxidizing agent in a liquid copper etching solution and mixing this solution, instead of spraying droplets of liquid copper etching solution into the gaseous oxidizing agent as in the prior art. The process of the present invention is improved in terms of at least the speed of the oxidation and the quality of the etching. This is at least partly due to that the rate of mass transfer between two phases depends on the area of contact in between the two phases and the density of each the two phases. The inventors have found it easier and more efficient to provide gaseous bubbles having a relatively high contacting surface in a continuous liquid phase than the opposite. Further, the density of gas is generally much lower than the density of liquid.

Upon mixing, the process inventively offers a larger contact surface in between the oxygen gas and/or air and the reduced copper etching solution by facilitating mass transfer of oxygen from oxygen gas and/or air into the liquid solution, thereby allowing the oxidation reaction to occur.

According to a first aspect of the invention, this and other objects are achieved by a process of oxidizing copper in a copper etching solution by using oxygen gas and/or air as an oxidizing agent, the process comprising the steps of:

a) introducing the oxidizing agent into an acidic reduced copper etching solution comprising $Cl^-$ and $Cu^+$;

b) stirring the solution obtained in step a); and thereby allowing the reaction $2Cu^+ + \frac{1}{2}O_2$ (aq)$+2H^+ \rightarrow 2Cu^{2+} + H_2O$ to occur, thereby producing an oxidized copper etching solution comprising less $Cu^+$ than the reduced copper etching solution.

In an example of the invention, a process of oxidizing copper in a copper etching solution by using oxygen and/or air as an oxidizing agent is provided wherein the process comprising the steps of:

a) introducing the oxidizing agent into an acidic reduced copper etching solution comprising $Cl^-$ and $Cu^+$;

b) mixing the solution obtained in step a);

thereby allowing the reaction $2Cu^+ + \frac{1}{2}O_2$ (aq)$+2H^+ \rightarrow 2Cu^{2+} + H_2O$ to occur, thereby producing an oxidized copper etching solution comprising less $Cu^+$ than the reduced copper etching solution.

The oxidized copper etching solution comprises an amount of $Cu^+$ being lower than the amount of $Cu^+$ in the reduced copper etching solution.

The pH of the reduced copper etching solution is below 7, allowing the reaction $2Cu^+ + \frac{1}{2}O_2$ (aq)$+2H^+ \rightarrow 2Cu^{2+} + H_2O$ consuming free protons, i.e. $H^+$ (aq), to occur. The acidic pH is typically provided by HCl (aq).

The inventors have surprisingly found that oxygen gas and/or air can be used as the oxidizing agent in a process of the present invention, despite the fact that both oxygen gas and air have a substantially lower oxidation ability than conventional oxidizing agents, such as hydrogen peroxide, sodium chlorate or gas comprising ozone or chlorine gas. However, oxygen gas and/or air have been found still meet the required level of oxidation ability of the inventive process enabling a desirable etching speed of the process and satisfying the overall process conditions.

An advantage of replacing the conventional oxidizing agents, such as hydrogen peroxide and sodium chlorate, is that the presence of harmful gases can be eliminated, thereby improving the working environment where such agents are conventionally used. Consequently, the environment for maintenance work may be improved. A further advantage is less emissions of environmentally unfriendly compounds, e.g. the conventional oxidizing agents themselves or any derivative thereof or any by-product from their oxidation reactions.

The inventors have further surprisingly found that the process of the present invention provides an improved etching characteristic at a flank of the printed circuit board being etched. By using the process of the present invention, the flank gets a straighter vertical profile than may be obtained by conventional processes, signifying an improved etching factor. The conductive portions of the printed circuit board may consequently be arranged closer to each other without jeopardizing the quality of the printed circuit board. Consequently, the process of the invention may allow for compacter printed circuit boards with acceptable quality. The improved etching may be at least partly due to the improved oxidation of copper promoted by the mixing.

Another advantage is that an oxidizing agent of oxygen gas and/or air offers a more economical alternative than the conventional oxidizing agents. The cost savings may be at least 80%, such as at least 90% with regard to the oxidizing agent(s) as raw material.

A further advantage is that there exists the possibility of an integrated process of removing excess copper which accumulates in the system, if the concentration of free acid of hydrochloric acid is kept low compared to in an conventional etching solution. This technology is further described in WO 2009/008801. By the term "copper etching solution", is herein meant an etching solution comprising copper. The copper is dissolved in the etching solution and in the form of $Cu^+$ and/or $Cu^{2+}$. The copper etching solution is a aqueous solution.

By the term "oxidizing agent", is herein meant a compound, such as oxygen gas and/or air, which is able to accept an electron from another atom, ion or molecule. In the inventive process, the oxygen and/or air acts as the oxidizing agent and accepts, in the oxidizing reaction (ii): $2Cu^+ + \frac{1}{2}O_2$ (aq)$+2H^+ \rightarrow 2Cu^{2+}+H_2O$, an electron from $Cu^+$, thereby $Cu^+$ is oxidized to $Cu^+$.

By the term "reduced copper etching solution", is herein meant an aqueous copper etching solution, wherein a certain amount of divalent copper ions ($Cu^{2+}$) has been reduced to monovalent copper ions ($Cu^+$) in the etching reaction (i). The reduced copper etching solution is a copper etching solution exiting an etching machine upstream of an oxidation reactor.

By the term "oxidized copper etching solution", is herein meant an aqueous copper etching solution, wherein a certain amount of monovalent copper ions ($Cu^+$) has been oxidized to divalent copper ions ($Cu^{2+}$) via the oxidation reaction (ii). The oxidized copper etching solution comprises a lower content of $Cu^+$ than the reduced copper etching solution. The oxidized copper etching solution is a copper etching solution exiting the oxidation reactor.

By the term "mixed solution", is herein meant an intermediate copper etching solution mixed with an oxidizing agent. In the mixed solution, the oxidizing agent is at least partly dissolved in the liquid phase. The mixed solution is mixed by e.g. impeller and/or static mixers or any other mixing means known in the industry. The mixed solution may be present in the oxidation reactor. The mixed solution may also be present in the feeding pipe downstream of an inlet of the feeding pipe for the oxidizing agent. The intermediate copper etching solution may comprise a mixture of the oxidized copper etching solution and the reduced copper etching solution. The intermediate copper etching solution comprises a content of $Cu^+$ being in between the content of $Cu^+$ of the reduced copper etching solution and the content of $Cu^+$ of the oxidized copper solution.

By the term "oxidation reactor", is herein meant a continuous rector, a tubular reactor, or a pipe, or a batch reactor.

By the term "stirring", is herein meant a specific type of mixing, namely an active mixing which is performed by a stirrer. The stirring may improve the rate of mass transfer between the gas phase and the liquid phase, by e.g. further decreasing the size of the gas bubbles of oxidizing agent in the oxidation reactor. The stirrer may increase the speed of the oxidation of the reaction $2Cu^+ + \frac{1}{2} O_2$ (aq)$+2H^+ \rightarrow 2Cu^{2+}+H_2O$. The stirrer may have movable parts, such as baffles, which mechanically decreases the size of the gas bubbles of oxidizing agent. The inventors have noticed that by increasing the speed of the baffles, a higher yield of the introduced oxidizing agent may be obtained. The inventors believe that the stirring in step b) may be a key factor for the success of the process of oxidizing copper in a copper etching solution in providing a satisfying and industrial applicable speed of oxidation of the oxidizing agent. The stirrer may be any stirrer known in the industry which during operation may reduce the size of the gas bubbles of the oxidizing agent. In some examples, the diameter of the oxygen gas bubbles formed in the liquid phase of the etching solution during mixing may be at most 5 mm, such as in the range of from 0.001 to 5 mm, or such as in the range of from 0.01 to 1 mm. The oxygen gas bubbles preferably provide a large contacting surface between the two phases (gaseous and liquid). Preferably, the gas bubbles are rather present in the liquid bulk than at the liquid surface inside the oxidation reactor.

In some embodiments, the process of oxidizing copper in a copper etching solution is in a system comprising an etching machine and an oxidation reactor fluidly connected by a feeding pipe.

In some embodiments, the oxidizing agent is introduced into the acidic reduced copper etching solution comprising $Cl^-$ and $Cu^+$ in the feeding pipe.

In some embodiments, the solution obtained in step a) is stirred in the oxidation reactor.

In some embodiments, the produced oxidized copper etching solution which is exiting from the oxidation reactor comprising less $Cu^+$ than the reduced copper etching solution which is exiting from the etching machine.

In some embodiments, the reduced copper etching solution comprising $Cl^-$ in a concentration of at least 2.5 mol/L. In other embodiments, the reduced copper etching solution comprising $Cl^-$ in a concentration of at least 3 mol/L, such as at least 3.5 mol/L, or such as of at least 4 mol/L. An advantage of having a minimum concentration of chloride ions is to ensure the speed of reaction is kept at a higher level.

In some embodiments, the $Cl^-$ is derived from chloride salts of copper, ammonium, alkali metals and alkaline earth metals, and hydrochloric acid. In some embodiments, the compound comprising the $Cl^-$ is selected from in the group consisting of HCl, NaCl, KCl, $MgCl_2$, $CaCl_2$, $NH_4Cl$.

In some embodiments, the step b) is performed by at least one stirrer, such as an impeller.

In some embodiments, the process further comprises the step of mixing the oxidizing agent with the acidic reduced copper etching solution in the feeding pipe.

In some embodiments, the mixing is performed by at least one static mixer.

In some embodiments, the pressure in the oxidation reactor is lower than the pressure in the feeding pipe.

In some embodiments, the step a) occurs upstream of an oxidation reactor.

In some embodiments, the step b) occurs in a feeding pipe arranged upstream of the oxidation reactor and inside of the oxidation reactor.

In some embodiments, the step b) occurring upstream of the oxidation reactor is performed by at least one static mixer for obtaining turbulent flow and wherein step b) occurring inside of the oxidation reactor is performed by at least an impeller for obtaining agitation.

In some embodiments, there is an overpressure in the feeding pipe and wherein the overpressure preferably being in the range of from 0.01 to 15 bar.

The pressure in the feeding pipe must exceed the pressure exerted on the inlet of the oxidation reactor by the liquid in the oxidation reactor. The exerted pressure is dependent on the height of and the density of the liquid present in the oxidation reactor. Thus, the pressure inside the oxidation reactor is typically lower than the pressure inside the feeding pipe. An advantage of increasing the pressure in the feeding pipe is that the solubility of oxygen in liquid increases, thereby promoting the oxidation reaction. After pressure drop in the oxidation reactor small gas bubbles are generated from the oversaturated liquid throughout the liquid volume of the reactor favourable from a mass transport point of view.

In some embodiments, the oxidation reactor is a continuous reactor, the size is chosen to ensure optimized process conditions which allow a sufficient mixing to form a turbulence throughout the volume of the reactor.

In some embodiments, a plurality of oxidation reactors are coupled in parallel. In other embodiments, a plurality of oxidation reactors are coupled in series.

In some embodiments, the reduced copper etching solution and the oxidized copper etching solution is having a temperature in the range of from 20 to 60° C., such as 45 to 55° C., or such as of about 50° C. The temperature of the mixed solution, the reduced copper etching solution and the oxidized copper etching solution is preferably in the range of from 45 to 55° C. and more preferably in the range of from 50 to 55° C. On the one hand, the etching reaction becomes undesirably slow below 45° C. On the other hand, the etching machine is sensitive to temperatures of above 55° C. However, the oxidation reaction is favoured by a relatively high temperature. Preferably, the temperature of the solutions is kept at a substantially constant value in the system. For instance, the oxidation reactor and/or pipes of the system may be isolated.

In some embodiments, the oxidized copper etching solution comprises copper in a total concentration within the range of from 80 to 260 g/L, $Cu^+$ in a concentration within the range of from 0 to 19.5 g/L, HCl (aq) in a concentration within the range of from 1 to 4 mol/L, and $Cl^-$ in a total concentration within the range of from 2.5 to 12 mol/L.

In some examples, the reduced copper etching solution comprises copper in a total concentration within the range of from 81 to 260 g/L, $Cu^+$ in a concentration within the range of from 0.5 to 20 g/L, HCl (aq) in a concentration within the range of from 1 to 4 mol/L, and $Cl^-$ in a total concentration within the range of from 2.5 to 12 mol/L.

In some embodiments, the reduced copper etching solution comprises copper in a total concentration within the range of from 81 to 260 g/L, $Cu^+$ in a concentration within the range of from 0.01 to 20 g/L, HCl (aq) in a concentration within the range of from 1 to 4 mol/L, and $Cl^-$ in a total concentration within the range of from 2.5 to 12 mol/L.

In some embodiments, the oxidized copper etching solution comprises copper in a total concentration within the range of from 80 to 260 g/L, $Cu^+$ in a concentration within the range of from 0 to 19.5 g/L, HCl (aq) in a concentration within the range of from 0.01 to 1 mol/L, and $Cl^-$ in a total concentration within the range of from 2.5 to 12 mol/L, such as in the range of from 3.5 to 12 mol/L.

In some examples, the reduced copper etching solution comprises copper in a total concentration within the range of from 81 to 260 g/L, $Cu^+$ in a concentration within the range of from 0.5 to 20 g/L, HCl (aq) in a concentration within the range of from 0.01 to 1 mol/L, and $Cl^-$ in a total concentration within the range of from 2.5 to 12 mol/L.

In some embodiments, the reduced copper etching solution comprises copper in a total concentration within the range of from 81 to 260 g/L, $Cu^+$ in a concentration within the range of from 0.01 to 20 g/L, HCl (aq) in a concentration within the range of from 0.01 to 1 mol/L, and $Cl^-$ in a total concentration within the range of from 2.5 to 12 mol/L.

In some embodiments, the oxidized copper etching solution comprises copper in a total concentration within the range of from 104 to 239 g/L, $Cu^+$ in a concentration within the range of from 3 to 6 g/L, HCl (aq) in a concentration within the range of from 0.01 to 0.5 mol/L, and $Cl^-$ in a total concentration within the range of from 3.4 to 7.7 mol/L.

In some embodiments, the reduced copper etching solution comprises copper in a total concentration within the range of from 105 to 240 g/L, $Cu^+$ in a concentration within the range of from 5 to 8 g/L, HCl (aq) in a concentration within the range of from 0.01 to 0.1 mol/L, and $Cl^-$ in a total concentration within the range of from 3.4 to 7.7 mol/L.

In some embodiments, step b) occurs inside of a feeding pipe arranged upstream of the oxidation reactor and/or inside of the oxidation reactor.

In a further aspect, the invention provides an oxidized copper etching solution obtainable by the process according to the present invention.

In another aspect, the invention provides a printed circuit board obtainable by etching using the oxidized copper etching solution according to the present invention.

In another aspect, use of an oxidized copper etching solution according to the invention for etching a printed circuit board is provided.

In a further aspect, a system for oxidizing a copper etching solution allowing the reaction $2Cu^+ + \frac{1}{2}O_2$ (aq) $+ 2H^+ \rightarrow 2Cu^{2+} + H_2O$ to occur is provided, wherein the system comprising:

an etching machine having an outlet for a reduced copper etching solution;

an oxidation reactor having an inlet for a mixed copper etching solution of the oxidation reactor and an outlet for an oxidized copper etching solution of the oxidation reactor, the oxidation reactor further comprising at least one stirrer; and a feeding pipe being connected between the outlet of the etching machine and the inlet of the oxidation reactor, the feeding pipe comprising an inlet for an oxidizing agent being oxygen gas and/or air.

Effects and features of this aspect of the present invention are analogous to those described above in relation to the previous aspects of the present invention.

The system may be adapted to allow the reaction $2Cu^+ + \frac{1}{2}O_2$ (aq) $+ 2H^+ \rightarrow 2Cu^{2+} + H_2O$ to occur in at least the oxidation reactor, thereby producing an oxidized copper etching solution exiting from the oxidation reactor comprising less $Cu^+$ than the reduced copper etching solution exiting from the etching machine.

The oxidizing agent may be adapted to be introduced into an acidic reduced copper etching solution comprising $Cl^-$ and $Cu^+$ in the feeding pipe.

In some embodiments, the inlet for reduced copper etching solution is arranged in the bottom of the oxidation reactor and the outlet for the oxidized copper etching solution is arranged at the top of the oxidation reactor, In some embodiments, the pressure in the oxidation reactor is lower than the pressure in the feeding pipe.

In some embodiments, the at least one stirrer is placed in proximity of the inlet of the oxidation reactor.

In some embodiments, the at least one stirrer is an impeller.

In some embodiments, the oxidation reactor comprising at least two stirrers.

In some embodiments, the feeding pipe further comprises at least one static mixer arranged downstream of the inlet for the oxidizing agent.

In some embodiments, the oxidation reactor further comprises an internal circulation system comprising at least one pump and at least one venturi injector.

In some embodiments, the impeller comprising baffles.

BRIEF DESCRIPTION OF THE DRAWINGS

Referring now to the Figures, which are exemplary embodiments, wherein.

DETAILED DESCRIPTION OF THE INVENTION

Figure 6:
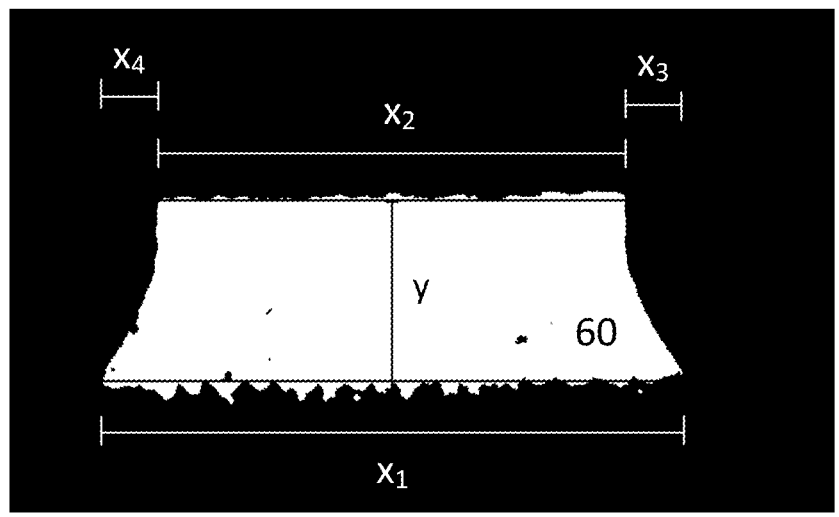
FIG. 6 is a cross section of a copper conductor of a printed circuit board, which has been produced in a conventional etching process using a conventional copper etching solution, comprising a high amount of acid.
Figure 7:
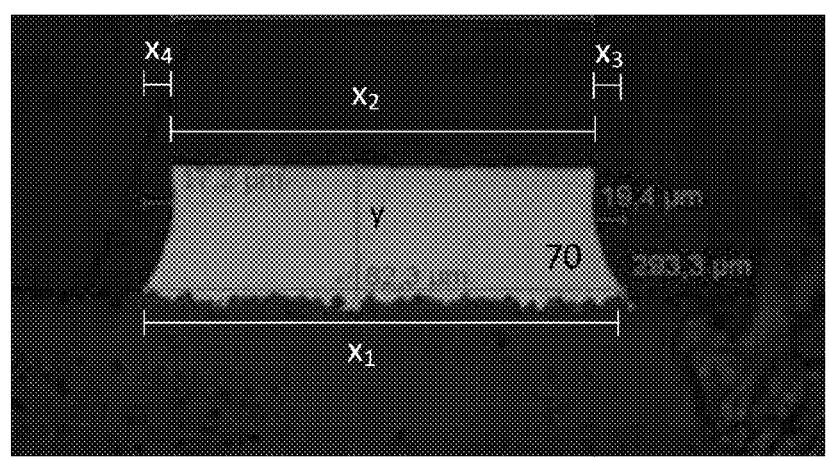
FIG. 7 is a cross section of a copper conductor of a printed circuit board, which has been produced in the inventive process using a conventional copper etching solution comprising a high amount of acid.
Figure 8:
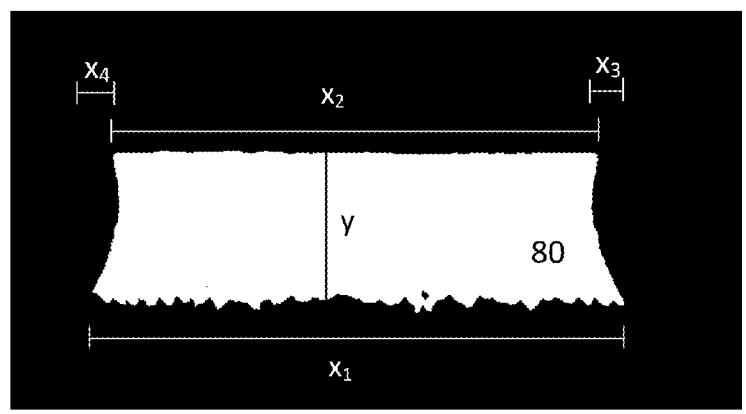
FIG. 8 is a part of a printed circuit board prepared by a cross section of a copper conductor of the printed circuit board, which has been produced in the inventive process using an improved copper etching solution comprising a low amount of acid.

Examples of the process according to two embodiments of the present invention will now be described in more detail with reference to the schematic representations in FIGS. 3-4 and FIG. 5, respectively. However, the general concepts of the process will be described firstly referring to the flowchart in FIG. 1 and a simple embodiment shown in FIG. 2. Referring to FIGS. 6-8, experimental results will be described more in detail.

Figure 1:
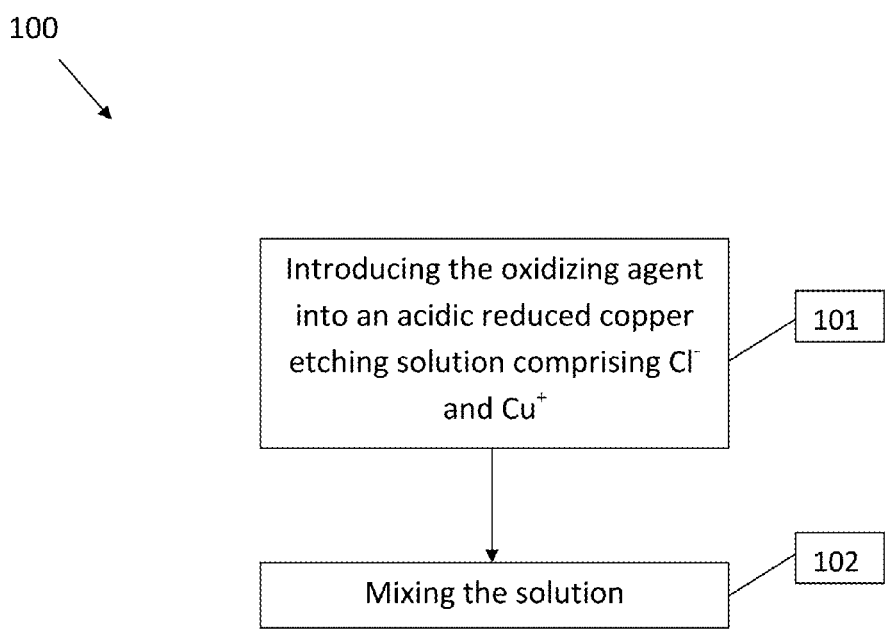
FIG. 1 is a flow chart depicting one example of a process of oxidizing copper in a copper etching solution by using oxygen gas and/or air as an oxidizing agent according to the present invention.

FIG. 1 shows a flow chart of a process 100 of oxidizing copper in a copper etching solution by using oxygen gas and/or air as an oxidizing agent according to the present invention. In a first step 101, the oxidizing agent is introduced into a reduced copper etching solution comprising Cl⁻ and Cu⁺. In a second step 102, the solution obtained in step 101 is mixed to form a mixed solution. The mixing step may be performed e.g. by static mixers in a feeding pipe and/or by impellers in an oxidation reactor. Typically the mixing is performed by at least one impeller, so called stirring.

Figure 2:
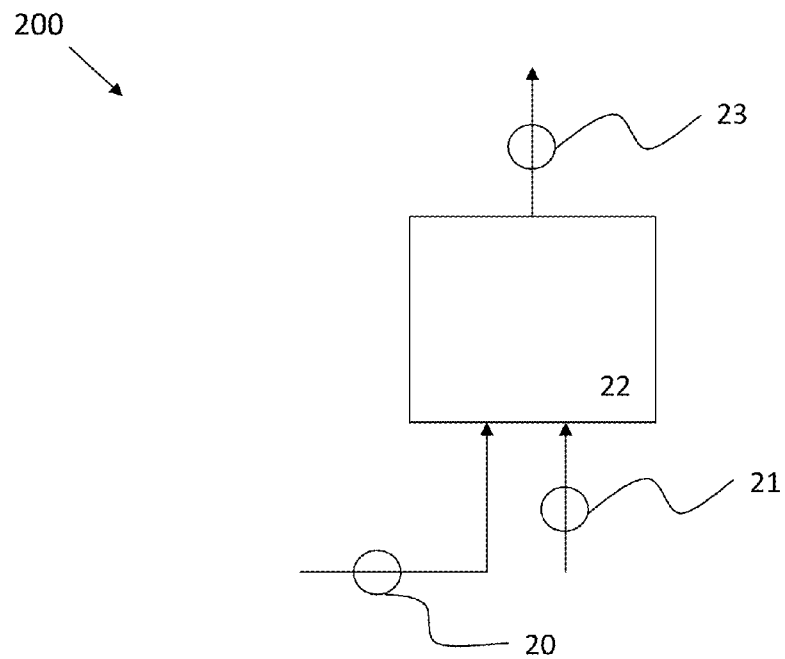
FIG. 2 is a schematic representation depicting one example of introduction of oxygen gas and/or air directly into an oxidation reactor.

The process of the present invention typically takes place in a system for producing etched printed circuit boards. The two main components of such a system are an etching machine and an oxidation reactor, which are directly fluidly connected with each other, e.g. by a feeding pipe, thereby forming a closed circuit. In FIG. 2, the oxidation reactor 22 is schematically shown.

In the etching machine, printed circuit boards are contacted with a copper etching solution comprising $Cu^{2+}$ in order to allow the etching reaction (i) to occur.

$$Cu^0 + Cu^{2+} \rightarrow 2Cu^+ \quad (i)$$

An oxidized copper etching solution comprising $Cu^{2+}$ is introduced into the etching machine, and subsequent to the etching reaction (i), a reduced copper etching solution comprising less $Cu^{2+}$ than the oxidized copper etching solution is obtained. Subsequently, the reduced copper etching solution 20 is removed from the etching machine and supplied to the oxidation reactor via a feeding pipe.

In the oxidation reactor 22, the reduced copper etching solution 20 is oxidized by an oxidizing agent 21, i.e. oxygen gas and/or air, according to the oxidation reaction (ii), thereby producing an oxidized copper etching solution 23 exiting the oxidation reactor, and which may be reused in the etching machine.

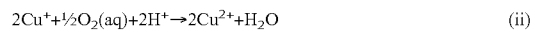

$$2Cu^+ + \tfrac{1}{2}O_2(aq) + 2H^+ \rightarrow 2Cu^{2+} + H_2O \quad (ii)$$

In FIG. 2, the continuous oxidation reactor, schematically shown, may have a reactor volume of 0.5 m³. More than one continuous oxidation reactor may be present, typically in parallel as shown in FIG. 5. The liquid steady state flow may be selected such as to provide a retention time of the liquid in each of the continuous oxidation reactors to ensure sufficient reduction of $Cu^+$. This is knowingly to the skilled man done by varying the reactor volume or the reactor volumes and the liquid flow through the reactor or reactors.

The oxidizing agent, i.e. pure oxygen gas and/or air, may be introduced into the reduced copper etching solution upstream of the oxidation reactor, such as in the feeding pipe, (e.g. shown in FIGS. 3-4) or inside of the oxidation reactor (e.g. shown in FIG. 2). The oxidizing agent may be introduced both in the feeding pipe and in the oxidation reactor (embodiment not shown).

Figure 3:
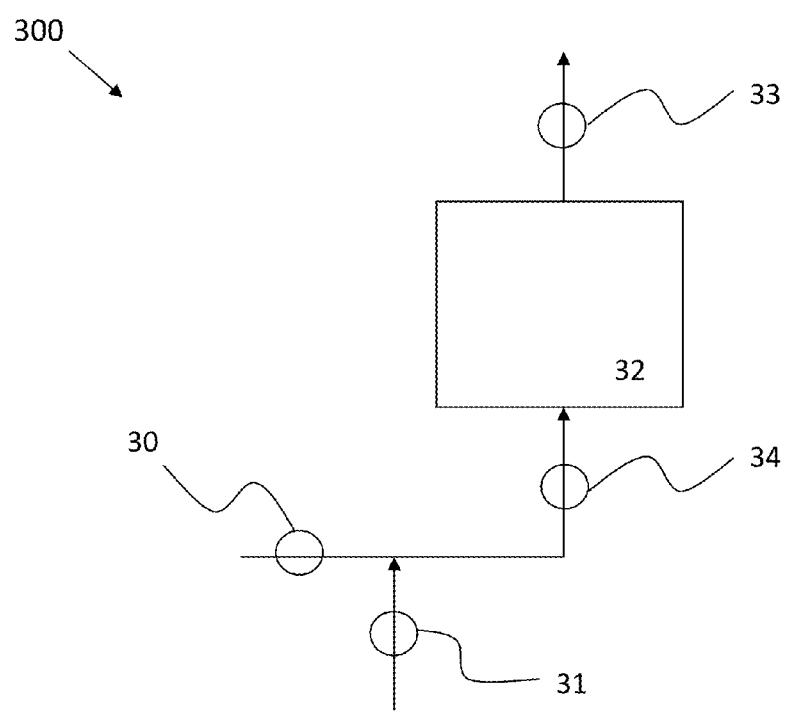
FIG. 3 is a is schematic representation depicting one example of introduction of oxygen gas and/or air into a feeding pipe conducting reduced copper etching solution upstream of an oxidation reactor.
Figure 4:
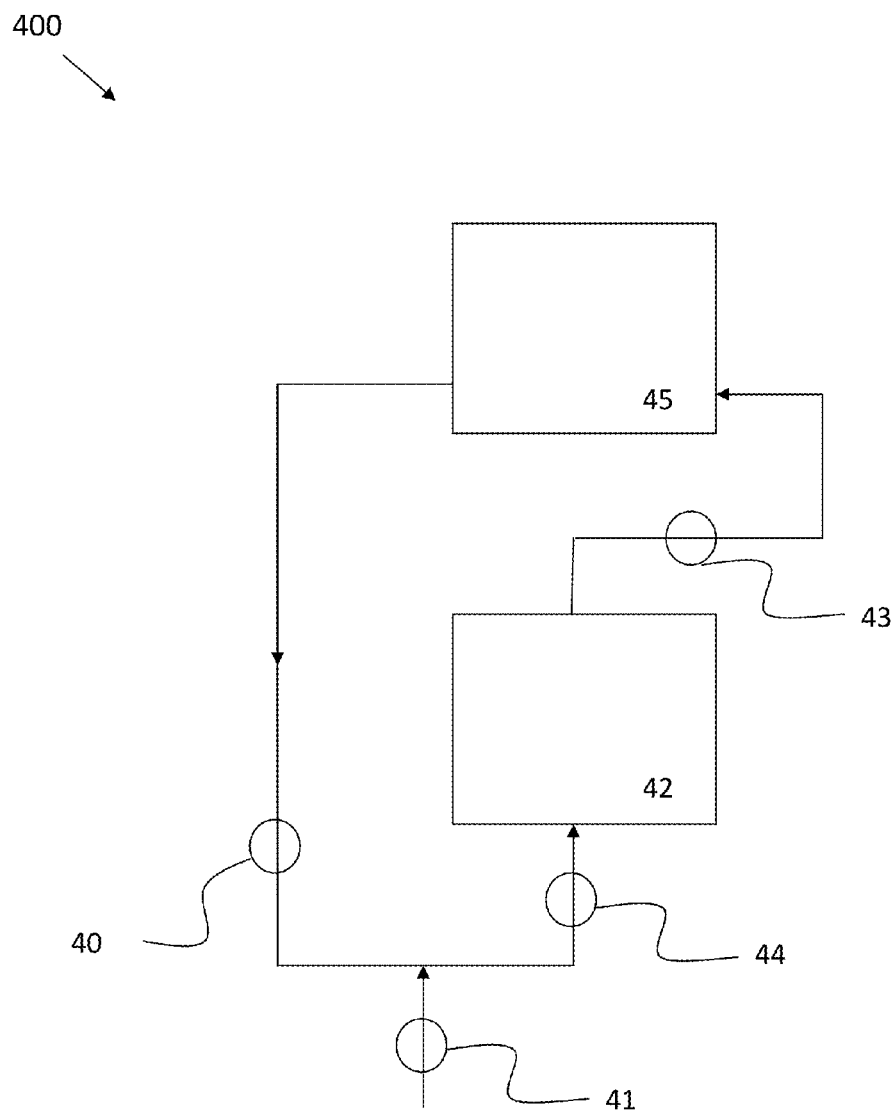
FIG. 4 is a schematic representation depicting one example of the inventive process.

In FIGS. 3-4, oxygen gas and/or air 31, 41 is introduced into a feeding pipe conducting reduced copper etching solution 30, 40, upstream of an oxidation reactor 32, 42, thereby forming a solution 34, 44. The feeding pipe is fluidly connecting the etching machine 45 (shown in FIG. 4) and the oxidation reactor 32, 42. The solution 34, 44 is introduced into the oxidation reactor 32, 42 via the bottom of the oxidation reactor 32, 42. The oxidation reactor herein comprises two impellers, for obtaining agitation in the oxidation reactor. One of the impellers is placed above in proximity of the inlet of the oxidation reactor 32, 42, which may suck the introduced solution and eject it to the towards the periphery of the oxidation reactor 32, 42, where baffles of the impeller are promoting agitation of the oxygen gas in the solution. The size of the bubbles of oxygen gas is further reduced, such as to increase the overall contacting surface between the gas phase and the liquid phase to promote the mass transfer of oxygen gas into the liquid solution. Dissolved oxygen is then available for reacting with $Cu^+$ and $H^+$ in the solution, such as to oxidize the $Cu^+$ to $Cu^{2+}$. An oxidized copper etching solution 33, 43 comprising less amount of $Cu^+$ than in the reduced copper etching solution 30, 40, is leaving the oxidation reactor 32, 42, from the top of the oxidation reactor 32, 42.

In the oxidation reactor 22, 32, 42, 52 the pressure can be reduced compared to the pressure in the feeding pipe conducting the reduced copper etching solution 20, 30, 40, 50, and optionally the oxidizing agent 31, 41, 51. Typically, the pressure in the oxidation reactor is in the range of from 0 to 0.1 bar overpressure. Due to the pressure difference, a portion of the previously dissolved oxygen forms small gas bubbles upon entry into the oxidation reactor.

The reduced copper etching solution and the oxidizing agent, either in a combined flow (e.g. shown in FIGS. 3-5) or in separate flows (e.g. shown in FIG. 2), are typically introduced into the oxidation reactor via the bottom of the oxidation reactor. The oxidized copper etching solution is typically removed from top of the oxidation reactor. Thus, the inlet of the oxidation reactor is typically arranged in the bottom of the oxidation reactor and the outlet of the oxidation reactor is typically arranged at the top of the oxidation reactor.

The reduced copper etching solution and the oxidized etching solution may comprise a relatively high or a relatively low content of HCl (aq) (see Table 1). In the case of a relatively low content of HCl (aq), an additional salt of chloride is added in order to assure a total content of Cl$^-$ in the range of from 2.5 to 12 mol/L in the two solutions, i.e. in the oxidized copper etching solution comprising a low amount of acid and in the reduced copper etching solution comprising a low amount of acid. Table 1 shows the different concentration intervals of the different compounds comprised in the reduced copper etching solution, comprising a low and a high concentration of acid, respectively, and the oxidized copper etching solution comprising a low and a high concentration of acid, respectively.

The relatively high content of HCl (aq) has the advantage of facilitating the oxidation reaction.

The relatively low content of HCl (aq) has the advantage of improved etching result and an improved working environment. At the low content of HCl (aq), it may be necessary to add a salt of Cl$^-$, such as NaCl, in order to complex bind with Cu$^+$ ions such that these will not negatively impact the etching speed.

Thereby, the total concentration of Cl$^-$ may be at quite similar levels in both copper etching solutions comprising a low and a high amount of acid, respectively.

TABLE 1

Concentration intervals of the different compounds comprised in the oxidized copper etching solution comprising a low amount of acid and a high amount of acid, respectively, and in the reduced copper etching solution comprising a low amount of acid and a high amount of acid, respectively.

| Compound | Oxidized copper etching solution comprising a low amount of acid | Oxidized copper etching solution comprising a high amount of acid | Reduced copper etching solution comprising a low amount of acid | Reduced copper etching solution comprising a high amount of acid |
| --- | --- | --- | --- | --- |
| Total concentration of copper [g/l] | 80-260 | 80-260 | 81-260 | 81-260 |
| Cu$^+$ [g/l] | 0-19.5 | 0-19.5 | 0.5-20 | 0.5-20 |
| HCl (aq) [mol/l] | 0.01-1 | 1-4 | 0.01-1 | 1-4 |
| Total Cl$^-$ [mol/l] | 2.5-12 | 2.5-12 | 2.5-12 | 2.5-12 |

The concentration of HCl (aq) in the oxidized copper etching solution is higher than 0.01 mol/L. By keeping the concentration of HCl (aq) above 0.01 mol/L, precipitation of copper hydroxide and a negative influence on the speed of the oxidation reaction (ii), respectively, can be avoided. It has further been tested with a concentration of Cu$^+$ in a range of from 0.01 to 20 g/l in a solution comprising a low amount of acid and a solution comprising a high amount of acid, respectively.

More specific concentration ranges of the chemical composition of the reduced copper etching solution having a low amount of acid obtained subsequent to reaction (i) is shown in Table 2.

TABLE 2

Composition of the reduced copper etching solution having a low amount of acid obtained subsequent to reaction (i).

| Total concentration of copper | 105-240 g/L |
| --- | --- |
| Cu$^+$ | 5-8 g/L |
| total Cl$^-$ | 3.4-7.7 mol/L |
| HCl (aq) | 0.05 mol/L |

More specific concentration ranges of the chemical composition of the oxidized copper etching solution having a low amount of acid obtained subsequent to reaction (ii) is shown in Table 3.

TABLE 3

Composition of the oxidized copper etching solution having a low amount of acid obtained subsequent to reaction (ii).

| Total concentration of copper | 104-239 g/L |
| --- | --- |
| Cu$^+$ | 3-6 g/L |
| total Cl$^-$ | 3.4-7.7 mol/L |
|  | CuCl$_2$ (+NaCl/KCl/NH$_4$Cl/MgCl$_2$/CaCl$_2$) |
| HCl (aq) | >0.01 mol/L, such as 0.02 mol/L |

The ratio of the concentration of monovalent copper ions Cu$^+$ to the concentration of divalent copper ions Cu$^{2+}$ is typically kept substantially constant in the etching machine.

The total content of copper (Cu$^+$ and Cu$^{2+}$ in combination) in the system is typically kept substantially constant. The total content of copper may be within the range of from 80 to 260 g/L.

It is important to keep the concentration of reduced copper ions Cu$^+$ low in the oxidized copper etching solution. By adding a high amount of salt of chloride into the copper etching solution, chloride ions may bind these copper ions to form a complex, CuCl$_2^-$, which form a complex according to the reaction (iii) during the etching process. Examples of suitable salts of chloride are NaCl, KCl, MgCl$_2$, CaCl$_2$ and/or NH$_4$Cl.

$$Cu^+ + 2Cl^- \rightarrow CuCl_2^- \qquad (iii)$$

The supply of oxidizing agent into the reduced copper etching solution may occur through a valve being controlled by a sensor measuring the redox potential (ORP) in the copper etching solution present in the etching machine. The sensor may have two critical limits for the redox potential, wherein the first limit indicates a need of additional supply of oxidizing agent and the second limit indicates a need of maximum supply of oxidizing agent is required. When using a sensor based on a Pt electrode having an Ag/AgCl electrode as reference, a divalent copper ion concentration of around 180 g/L, a monovalent copper ion concentration of around 8 g/L, a sodium chloride concentration of around 3.5 mol/L corresponding to a total chloride of 9.4 mol/L, the two critical limits have been measured to +510 mV and +505 mV, respectively.

A process control system, introduced in the paragraph above, may sense the level of $Cu^+$ in the etch machine by measuring the redox potential. An increased level of $Cu^+$ in the reduced copper etching solution causes a drop in the potential, eventually to a value below the critical limit. At the critical limit, a given flow of oxidizing agent can be supplied to the oxidation system. If the potential continues to drop, the gas flow of oxidizing agent can be set to successively higher levels. Eventually, at the second critical limit of a minimum redox potential, a level of maximum gas flow is supplied allowing the potential to increase and the oxidation and a balanced steady state situation can be attained in the oxidation reactor.

A steady state flow situation may thereby be obtained by means of the process control system, where the oxidized copper etching solution having a relatively lower content of $Cu^+$ balances the generation of $Cu^+$ through the etching reaction, such that the concentration of monovalent copper ions remains at an essentially constant level seen in the etching machine.

The feeding pipe typically comprises at least one static mixer, preferably a plurality of static mixers, enabling turbulent flow and overpressure inside the feeding pipe. Typically, the oxidizing agent is introduced into the feeding pipe upstream of the static mixer(s). The turbulent conditions will ensure a uniform distribution of the dissolved oxygen in the liquid phase. The feeding pipe may further include valves adapted to further regulate the pressure inside the feeding pipe and to maintain the turbulent flow. Herein, the feeding pipe has an overpressure of 1 bar. The overpressure increases the solubility of the oxidizing agent, herein the pure oxygen gas, in the copper etching solution, with reference to Henry's Law.

Example 1: Full-Scale Test Comprising the Process

Figure 5:
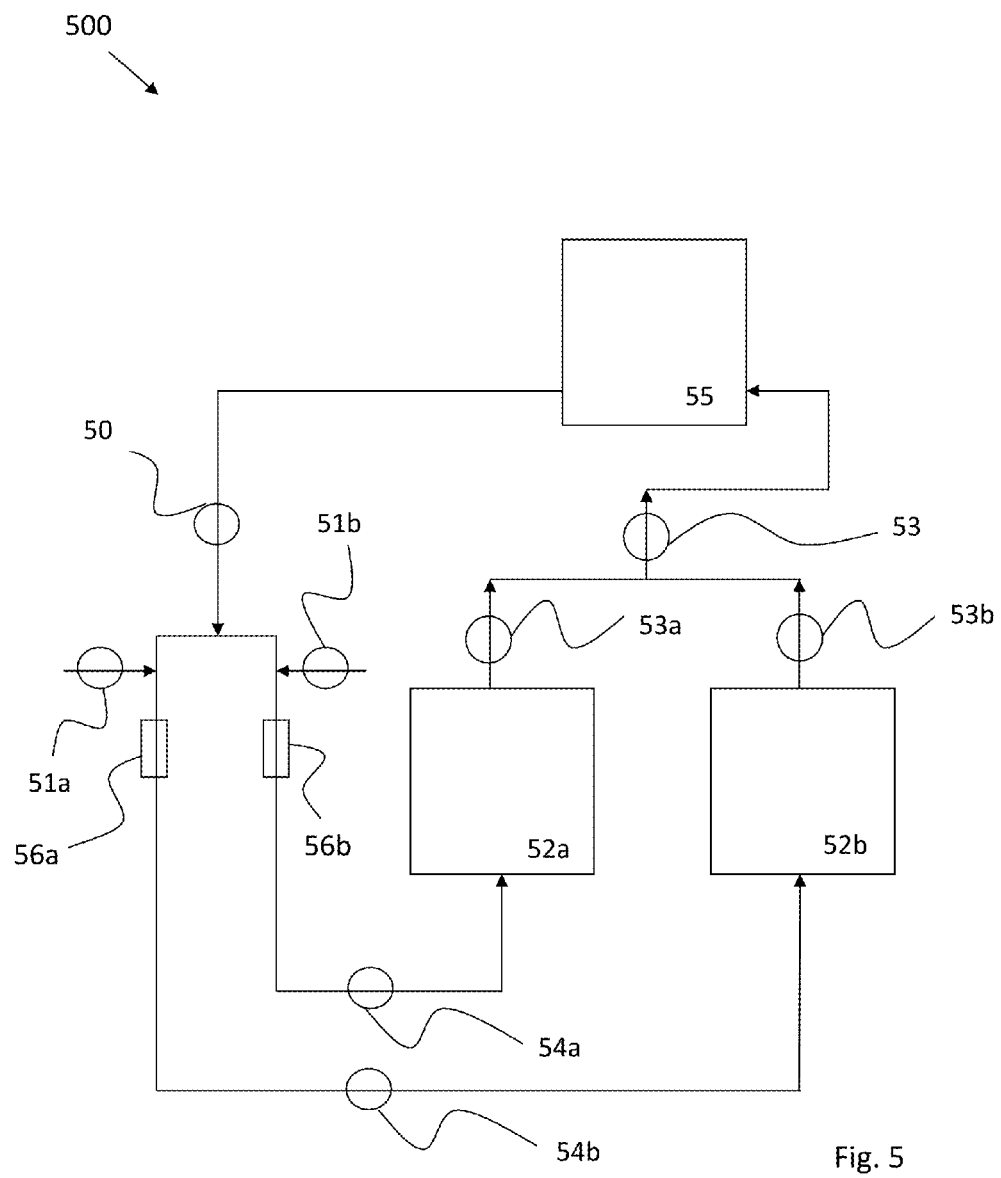
FIG. 5 is a schematic representation depicting a full scale example of the inventive process.

A full-scale test was performed in a system comprising two oxidation reactors arranged in parallel, schematically shown in FIG. 5. The volume of each of the oxidation reactors was 0.5 m³. The system further comprised an etching machine 55 consisting of three modules. The etching modules had in total a working capacity of 1.2 m³ copper etching solution. Consequently, the system in total had a total working capacity of 2.2 m³ copper etching solution.

Reduced copper etching solution 50 was supplied to a pump from the bottom of the etching machine via a feeding pipe. A common feeding pipe conducts the reduced copper etching solution to the pump, and from the pump to the oxidation reactors 52a-b, the reduced copper etching solution is conducted in two parallel feeding pipes, one to each oxidation reactor.

Closely downstream of the pump, each of the two feeding pipes are provided with an inlet for the oxidizing agent comprising a valve. The valves are controlled by sensors.

Downstream of the inlet for oxidizing agent 51a-b, each of the two feeding pipes is provided with a static mixer 56a-b providing overpressure and turbulent flow.

In between the static mixers and the oxidation reactors, manometers and additional valves may be provided to adjust the flow and the overpressure on the fluid before entry into each of the oxidation reactor. This example was conducted with an overpressure of 0.8 bar which increases the solubility of the oxidizing agent, herein the pure oxygen gas in the copper etching solution, with reference to Henry's Law.

The feeding pipe is arranged such that it forms an inlet for the mixed copper etching solution 54a-b in the bottom of the oxidation reactor. A first impeller is arranged above the inlet in order to agitate it inside of the oxidation reactor. The impeller creates turbulent agitation facilitating the mass transfer of oxygen between the gaseous phase and the liquid phase and further distribution throughout the liquid volume. Above of the first impeller, a second impeller is arranged to provide further agitation.

The oxidation reactor comprises a stirrer, herein an impeller, with a speed of 294 rpm, such as to form agitation and turbulence also inside of the oxidation reactor. Preferably, the stirrer is selected such as to allow agitation in substantially the entire reactor volume. The agitation disperses the oxygen gas bubbles in the liquid phase of the copper etching solution creating a large contacting surface between the liquid phase of the copper etching solution and the gaseous phase of the gas bubbles, thereby accelerating the oxidation reaction (ii) by promoting mass transfer of oxygen through the contacting surface between the gaseous phase and the liquid phase. Due to the turbulent conditions in the liquid phase oxygen having passed the phase boundary will be homogenously distributed in the liquid phase where it is consumed according to the reaction above (ii).

The oxidation reactors further comprise an internal circulation system comprising pumps and venturi injectors. The internal circulation system assists in generation of small bubbles within the liquid phase which increases the efficiency of the oxidizing agent used in the system.

At the top of each oxidation reactor 52a-b, an outlet, herein overflow, for the oxidized copper etching solution 53a-b is arranged. The outlet flows from each of the two oxidation reactors may be combined 53 and connected to a return pipe fluidly connected to the etching machine 55.

In the full-scale test, using an copper etching solution with a relatively low content of HCl (aq), a divalent copper ion concentration of about 180 g/L, a monovalent copper ion concentration of about 8 g/L, a sodium chloride concentration of about 3.5 mol/L corresponding to a total chloride of 9.4 mol/L and a flow of pure oxygen gas at 28 Nm³/h, the system managed an etching load of 45 kg copper/h without falling below a redox potential (ORP) of +505 mV.

In the full-scale test, a conventional pH electrode was used to control the dosage of concentrated hydrochloric acid into the copper etching solution in the etching machine in order to keep the concentration of HCl (aq) constant and low, herein, at 0.05 mol/L. Further, a conventional density sensor was used to control the dosage of water into the copper etching solution in the etching machine in order to keep the total concentration of copper constant, herein, at 190 g/L. The target value for the density was 1.42 g/cm³.

TABLE 4

Parameters in a specific example.

| | |
|---|---|
| Volume of each of the two oxidation reactors | 0.5 m³ |
| Dimension of each of the two oxidation reactors (L × W × H) | 0.74 × 0.74 × 1.34 m |
| Diameter of the feeding pipe | 75 mm |
| Volume of each of the three etch modules | 0.4 m³ |
| Retention time of the copper etching solution inside each of the two oxidation reactors | 0.05 h |
| Etching load of copper | 45 kg/h |
| Redox potential (ORP) | >+505 mV |
| Liquid volume flow | 24 m³/h |
| Gas volume flow of pure oxygen | 28 Nm³/h |
| Speed of the impeller inside the oxidation reactor | 294 rpm |

TABLE 4-continued

Parameters in a specific example.

| | |
|---|---|
| Overpressure inside the feeding pipe | 0.8 bar |
| Overpressure inside the oxidation reactor | 0 bar |
| Temperature of the reduced copper etching solution | 50° C. |
| Temperature of the oxidized copper etching solution | 50° C. |
| Concentration of HCl (aq) in the copper etching solution | 0.05 mol/L |
| Total concentration of copper in the copper etching solution | 190 g/L |
| Density of copper etching solution | 1.42 g/cm$^3$ |

Ventilation of the oxidation reactor(s) were connected to the etching system whereby excess oxidizing agent could exit through the process ventilation of the etching line. The exited oxidizing agent may be recirculated to the oxidation reactor(s).

Example 2: Etched Flanks of Copper Conductors

As described above, the conductor of a printed circuit board preferably has flanks with a vertical profile. The inventive process produces flanks having a straighter vertical profile than one obtained in conventional processes. In this way they, conductors of the printed circuit board may be produced closer to each other without jeopardizing the quality of the printed circuit board.

FIG. 6 shows a part of a printed circuit board, and more specifically a cross section of a copper conductor 60 of the printed circuit board, which has been produced by a conventional combined etching and oxidation process using a conventional copper etching solution comprising a high amount of acid.

In the conventional etching and oxidation process, the oxidation agent was hydrogen peroxide. The hydrogen peroxide was added to the etching machine via a venturi pipe. Thus, the oxidation of copper took place in the etching machine. No extra mixing was performed except the mixing naturally occurring in the venturi pipe and an internal circulation between the three etching modules enforced by a circulation pump.

The conventional copper etching solution comprising a high amount of acid, as measured in the etching machine, used in the conventional etching and oxidation process had a composition comprising:
   total copper: 115 g/L;
   $Cu^+$: 2 g/L;
   HCl (aq): 3.5 mol/L;
   NaCl: 0 mol/L;
   total $Cl^-$: 7.1 mol/L.

The copper conductor was photographed in a microscope allowing the dimensions of the copper conductor to be measured. The copper conductor 60 has an upper width $x_2$, a lower width $x_1$, a first flank width $x_3$, and a second flank width $x_4$. The upper width $x_2$ has been measured to 230.9 µm, the lower width $x_1$ to 289 µm, the first flank width to 29.1 µm, and the second flank width $x_4$ to 28 µm. The height y of the copper conductor 60 is 84 µm.

FIG. 7 shows a part of a printed circuit board, and more specifically a cross section of a copper conductor 70 of the printed circuit board, which has been produced by a conventional etching process combined with an inventive oxidation process using a conventional copper etching solution.

In the inventive oxidation process, the oxidation agent was oxygen gas. The oxygen gas was added to a feeding pipe downstream of the etching machine and upstream of an oxidation reactor. Thus, the oxidation of copper took place in the feeding pipe and/or the oxidation reactor. Mixing was performed in the feeding pipe using one static mixer, and/or in the oxidation reactor using two impellers.

The conventional copper etching solution, comprising a high amount of acid, as measured in the etching machine, used in the inventive oxidation process had a composition comprising:
   total copper: 115 g/L;
   $Cu^+$: 2 g/L;
   HCl (aq): 3.5 mol/L;
   NaCl: 0 mol/L;
   total $Cl^-$: 7.1 mol/L.

The copper conductor was photographed in a microscope allowing the dimensions of the copper conductor to be measured. The copper conductor 70 has an upper width $x_2$, a lower width $x_1$, a first flank width $x_3$, and a second flank width $x_4$. The upper width $x_2$ has been measured to 257.3 µm, the lower width $x_1$ to 293.3 µm, the first flank width to 19.4 µm, and the second flank width $x_4$ to 17.2 µm. The height y of the copper conductor 70 is 82.3 µm.

Thus, the copper conductor 70 shows a smaller flank width than the copper conductor 60 of FIG. 6. Hence the inventive oxidation process using a conventional copper etching solution is producing an improved printed circuit board as compared to when a conventional combined etching and oxidation process using a conventional copper etching solution is used.

FIG. 8 shows a part of a printed circuit board, and more specifically a cross section of a copper conductor 80 of the printed circuit board, which has been produced by a conventional etching process combined with an inventive oxidation process using a copper etching solution comprising a low amount of acid.

In the inventive oxidation process, the oxidation agent was oxygen gas. The oxygen gas was added to a feeding pipe downstream of the etching machine and upstream of an oxidation reactor. Thus, the oxidation of copper took place in the feeding pipe and/or the oxidation reactor. Mixing was performed in the feeding pipe using one static mixer, and/or in the oxidation reactor using two impellers.

The copper etching solution comprising a low amount of acid, as measured in the etching machine, used in the inventive oxidation process had a composition comprising:
   total copper: 190 g/L;
   $Cu^+$: 8 g/L;
   HCl (aq): 0.05 mol/L;
   NaCl: 3.5 mol/L;
   total $Cl^-$: 9.4 mol/L.

The copper etching solution comprising a low amount of acid, had a markedly lower concentration of HCl (aq) than the conventional copper etching solution. Instead, the chloride ions of the copper etching solution comprising a low amount of acid were provided by addition of a salt of chloride, namely, NaCl.

The copper conductor was photographed in a microscope allowing the dimensions of the copper conductor to be measured. The copper conductor 80 has an upper width $x_2$, a lower width $x_1$, a first flank width $x_3$, and a second flank width $x_4$. The upper width $x_2$ has been measured to 264.8 µm, the lower width $x_1$ to 294.9 µm, the first flank width to 14.5 µm, and the second flank width $x_4$ to 12.9 µm. The height y of the copper conductor 80 is 85 µm.

Thus, the copper conductor 80 shows a smaller flank width than both of the copper conductor 60 of FIG. 6 and the copper conductor 70 of FIG. 7. Hence the inventive oxidation process using the copper etching solution comprising a low amount of acid is producing an improved printed circuit board as compared to both when a conventional combined etching and oxidation process using a conventional copper etching solution, and when the inventive oxidation process using a conventional copper etching solution, respectively, is used.

The invention claimed is:

1. A process of oxidizing copper in a copper etching solution by using oxygen gas and/or air as an oxidizing agent, the process comprising the steps of:
   a) introducing the oxidizing agent into an acidic reduced copper etching solution comprising $Cl^-$ and $Cu^+$ such that gaseous bubbles are formed in the copper etching solution;
   b) stirring the solution obtained in step a) by at least one stirrer to reduce the size of the gaseous bubbles of the oxidizing agent; and
   thereby allowing the reaction $2Cu^+ + \frac{1}{2}O_2$ (aq) $+ 2H^+ \rightarrow 2Cu^{2+} + H_2O$ to occur, thereby producing an oxidized copper etching solution comprising less $Cu^+$ than the reduced copper etching solution.

2. The process according to claim 1, wherein the process of oxidizing copper in a copper etching solution is in a system comprising an etching machine and an oxidation reactor fluidly connected by a feeding pipe.

3. The process according to claim 2, wherein the oxidizing agent is introduced into the acidic reduced copper etching solution comprising $Cl^-$ and $Cu^+$ in the feeding pipe.

4. The process according to claim 2, wherein the solution obtained in step a) is stirred in the oxidation reactor.

5. The process according to claim 2, wherein the produced oxidized copper etching solution which is exiting from the oxidation reactor comprising less $Cu^+$ than the reduced copper etching solution which is exiting from the etching machine.

6. The process according to claim 2, wherein the process further comprises the step of mixing the oxidizing agent with the acidic reduced copper etching solution in the feeding pipe.

7. The process according to claim 6, wherein the mixing is performed by at least one static mixer.

8. The process according to claim 2, wherein the pressure in the oxidation reactor is lower than the pressure in the feeding pipe.

9. The process according to claim 2, wherein the feeding pipe has an overpressure.

10. The process according to claim 2, wherein the oxidizing agent is introduced into the acidic reduced copper etching solution comprising $Cl^-$ and $Cu^+$ in the feeding pipe arranged upstream of the oxidation reactor and/or inside of the oxidation reactor.

11. The process according to claim 2, wherein the process further comprises the step of mixing the oxidizing agent with the acidic reduced copper etching solution, and
    wherein the mixing is performed by at least one static mixer in the feeding pipe and/or by at least one impeller in the oxidation reactor.

12. The process according to claim 1, wherein the reduced copper etching solution comprises $Cl^-$ in a total concentration of at least 2.5 mol/L.

13. The process according to claim 1, wherein the $Cl^-$ is derived from at least one compound selected from the group consisting of: chloride salts of copper, ammonium, alkali metals and alkaline earth metals, and hydrochloric acid.

14. The process according to claim 1, wherein the step b) is performed by at least one stirrer being an impeller.

15. The process according to claim 1, wherein a plurality of oxidation reactors are coupled in parallel.

16. The process according to claim 1, wherein the reduced copper etching solution and the oxidized copper etching solution, respectively, have a temperature in the range of from 20 to 60°.

17. The process according to claim 1, wherein the oxidized copper etching solution comprises copper in a total concentration within the range of from 80 to 260 g/L, $Cu^+$ in a concentration within the range of from 0 to 19.5 g/L, HCl (aq) in a concentration within the range of from 1 to 4 mol/L, and $Cl^-$ in a total concentration within the range of from 2.5 to 12 mol/L.

18. The process according to claim 1, wherein the reduced copper etching solution comprises copper in a total concentration within the range of from 81 to 260 g/L, $Cu^+$ in a concentration within the range of from 0.01 to 20 g/L, HCl (aq) in a concentration within the range of from 1 to 4 mol/L, and $Cl^-$ in a total concentration within the range of from 2.5 to 12 mol/L.

19. The process according to claim 1, wherein the oxidized copper etching solution comprises copper in a total concentration within the range of from 80 to 260 g/L, $Cu^+$ in a concentration within the range of from 0 to 19.5 g/L, HCl (aq) in a concentration within the range of from 0.01 to 1 mol/L, and $Cl^-$ in a total concentration within the range of from 2.5 to 12 mol/L.

20. The process according to claim 1, wherein the reduced copper etching solution comprises copper in a total concentration within the range of from 81 to 260 g/L, $Cu^+$ in a concentration within the range of from 0.01 to 20 g/L, HCl (aq) in a concentration within the range of from 0.01 to 1 mol/L, and $Cl^-$ in a total concentration within the range of from 2.5 to 12 mol/L.

* * * * *